United States Patent
Tang et al.

(10) Patent No.: US 7,557,432 B2
(45) Date of Patent: Jul. 7, 2009

(54) THERMALLY ENHANCED POWER SEMICONDUCTOR PACKAGE SYSTEM

(75) Inventors: Wai Kwong Tang, Singapore (SG); You Yang Ong, Kuantan (MY); Kuan Ming Kan, Seremban (MY); Larry Lewellen, San Jose, CA (US)

(73) Assignee: Stats Chippac Ltd., Singapore (SG)

( * ) Notice: Subject to any disclaimer, the term of this patent is extended or adjusted under 35 U.S.C. 154(b) by 298 days.

(21) Appl. No.: 11/307,285

(22) Filed: Jan. 31, 2006

(65) Prior Publication Data

US 2007/0108564 A1    May 17, 2007

Related U.S. Application Data

(60) Provisional application No. 60/666,977, filed on Mar. 30, 2005, provisional application No. 60/671,554, filed on Apr. 15, 2005.

(51) Int. Cl.
*H01L 23/495* (2006.01)
*H01L 21/00* (2006.01)

(52) U.S. Cl. .................. 257/675; 257/673; 257/666; 257/E23.051; 438/123

(58) Field of Classification Search .............. 257/675, 257/673, 666, 75, E23.051; 438/123
See application file for complete search history.

(56) References Cited

U.S. PATENT DOCUMENTS

| | | | |
|---|---|---|---|
| 4,907,067 A | 3/1990 | Derryberry | |
| 4,935,803 A | 6/1990 | Kalfus et al. | 357/68 |
| 5,103,290 A * | 4/1992 | Temple et al. | 257/698 |
| 5,294,826 A | 3/1994 | Marcantonio et al. | 257/659 |
| 5,821,611 A * | 10/1998 | Kubota et al. | 257/673 |
| 6,204,554 B1 | 3/2001 | Ewer et al. | |
| 6,261,404 B1 | 7/2001 | Baska et al. | 156/310 |
| 6,307,755 B1 | 10/2001 | Williams et al. | 361/813 |
| 6,424,031 B1 | 7/2002 | Glenn | |
| 6,479,888 B1 * | 11/2002 | Hirashima et al. | 257/673 |
| 6,492,725 B1 | 12/2002 | Loh et al. | |
| 6,528,880 B1 | 3/2003 | Planey | |
| 6,765,292 B2 | 7/2004 | Cheah et al. | |
| 6,992,386 B2 * | 1/2006 | Hata et al. | 257/735 |
| 2003/0052408 A1 * | 3/2003 | Quinones et al. | 257/737 |
| 2005/0127483 A1 * | 6/2005 | Joshi et al. | 257/676 |
| 2006/0201709 A1 | 9/2006 | McIver | |

* cited by examiner

*Primary Examiner*—Nitin Parekh
(74) *Attorney, Agent, or Firm*—Mikio Ishimaru

(57) ABSTRACT

The present invention provides a thermally enhanced power semiconductor package system comprising providing a power semiconductor die, forming an upper lead frame on the power semiconductor die and forming a lower lead frame below the power semiconductor die, wherein the upper lead frame and the lower lead frame are provided in an offset configuration relative to each other to provide two heat dissipation paths.

20 Claims, 6 Drawing Sheets

US 7,557,432 B2

THERMALLY ENHANCED POWER SEMICONDUCTOR PACKAGE SYSTEM

CROSS-REFERENCE TO RELATED APPLICATIONS

This application claims the benefit of U.S. Provisional Patent Application Ser. No. 60/666,977 filed Mar. 30, 2005 and the subject matter thereof is hereby incorporated herein by reference thereto.

This application also claims the benefit of U.S. Provisional Patent Application Ser. No. 60/671,554 filed Apr. 15, 2005 and the subject matter thereof is hereby incorporated herein by reference thereto.

The present application contains subject matter related to a concurrently filed U.S. Patent Application entitled "Stackable Power Semiconductor Package System". The related application is assigned to STATS ChipPAC Ltd. and the subject matter thereof is incorporated herein by reference thereto.

TECHNICAL FIELD

The present invention relates generally to integrated circuit package systems, and more particularly to a system of thermally enhanced package for power semiconductor devices.

BACKGROUND ART

The use of solid-state electronics to replace electromechanical mechanisms in low-power consumer electronics has resulted in tremendous improvements in product performance, capability, and reliability. This can be attributed to rapid and novel advances in the semiconductor device and electronic packaging industries. Developments in high-power electronics packaging, driven by the military and industrial sectors emphasizing the transportation (e.g., next-generation shipboard systems and electric/electric-hybrid vehicles), aerospace (e.g., next-generation "fly-by-light, power-by-wire" jetliners), telecommunication (e.g., satellite power systems), and electric utility markets (e.g., inverter-based flexible AC transmission system controllers), is considered to be in an early stage of industry development. The main impetus for this effort is to enable development of common modular and integrated designs scalable to numerous applications which are constrained by reliability, mass, footprint, volume, manufacturing and cost considerations.

Heat management in power discrete semiconductor packages, in particular for DC-DC or DC-AC converters, has seen slow progress in terms of improved heat management. These converters often employ multiple parallel SO-8 devices, such as synchronous rectifiers, due to printed circuit board (PCB) real estate constraints. The layout of the PCB becomes congested due to the parallel arrangement of the original legacy power packages. Traditionally in SOIC leaded form, an SO-8 package is thermally inferior in handling high current and high power devices. Typically, the junction-to-solder point thermal resistance of an SO-8 device is in the range of 20 k/W to 30 k/W, depending on the chip size and current rating. This means the inferior thermal capability of the SO-8 package has necessitated the need to parallel multiple devices in order to spread the power dissipation and prevent any one device from running too hot. Unfortunately, too many devices in parallel, by occupying the PCB real estate, may also lead to excessive source-to-drain current discharges in the connecting MOSFET drivers, as well as having negative impact on the converter's overall efficiency.

Thus, a need still remains for a system of thermally enhanced stackable semiconductor packages. In view of the demand to shrink device form factors on PCB's and increase the power dissipation capabilities, it is increasingly critical that answers be found to these problems. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a thermally enhanced power semiconductor package system comprising providing a power semiconductor die, forming an upper lead frame on the power semiconductor die and forming a lower lead frame below the power semiconductor die, wherein the upper lead frame and the lower lead frame are provided in an offset configuration relative to each other to provide two heat dissipation paths.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
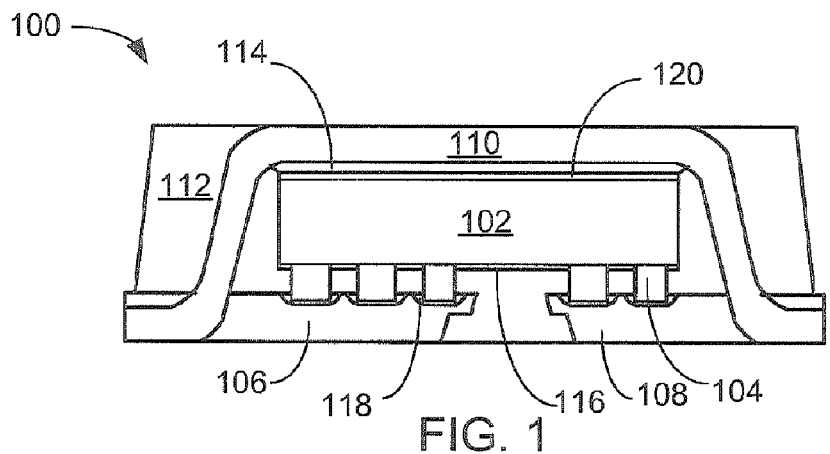
FIG. 1 is a cross-sectional view along line 1-1 of FIG. 2 of a thermally enhanced power semiconductor package system in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing Figures. Where multiple embodiments are disclosed and described, having some features in common, for clarity and ease of illustration, description, and comprehension thereof, similar and like features one to another will ordinarily be described with like reference numerals.

The term "horizontal" as used herein is defined as a plane parallel to the conventional plane or surface of the package top, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material, patterning, exposure, development, etching, cleaning, and/or removal of the material as required in forming a described structure.

Figure 2:
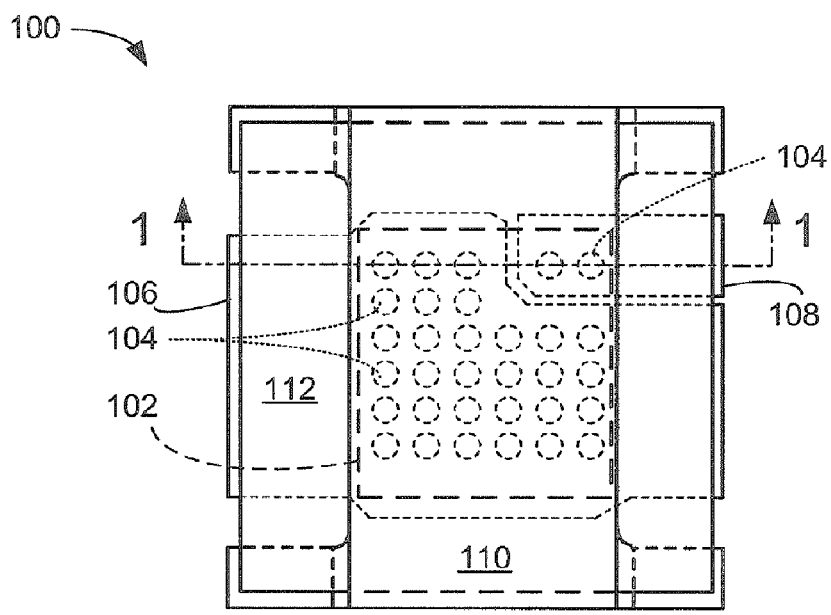
FIG. 2 is a top view of the system of FIG. 1 with some internal components shown.

Referring now to FIG. 1, therein is shown a cross-sectional view along line 1-1 of FIG. 2 of a thermally enhanced power semiconductor package system 100 in an embodiment of the present invention. The thermally enhanced power semiconductor package system 100 includes a power semiconductor die 102, interconnect structures 104, a source lead 106, a gate lead 108, and an upper lead frame 110 as a drain lead in a molding compound 112.

The power semiconductor die 102 is flipped so it has a die topside metallization layer 116, such as aluminum with phosphosilicate glass (PSG) over silicon nitride (SiN) and a backside metallization layer 120, of materials such as Ti/NiV/Ag or TiNi/Ag. The die topside metallization layer 116 has I/O pad openings in which the interconnect structures 104 are formed. The interconnect structures 104 are solder ball bumped with solder ball or solder pillar bump for the flip-chip interconnection.

The interconnect structures 104 are formed on a wafer before singulation or dicing of the power semiconductor die 102 by a process such as stencil printing of a soft conductor 114, such as solder paste, to form protruded balls/bumps and undergo reflow to form the solder balls or bumps.

In a further embodiment, electroless nickel and emersion gold (Ni/Au) or copper pre-stud (Al—NiV—Cu) under bump metallurgy (UBM) is grown in the I/O pad openings for pillar bumps (as shown).

The solder balls or pillar bumps may have bump height of 0.15-0.35 mm, with ball or bump pitch in the range of 200 μm and below. The junction-to-solder point thermal resistance of the current invention is usually in the range of 2 k/W to 3 k/W.

The interconnect structures 104 are between the power semiconductor die 102 and a stress relief layer 118. The stress relief layer 118 is of a material such as molybdenum to be able to expand or contract to absorb stresses caused by thermal expansion.

The soft conductor 114, such as solder paste, is on the backside metallization layer 120 to provide for electrical and/or heat transfer from the power semiconductor die 102 to the upper lead frame 110.

The upper lead frame 110 is constructed of 15-20 mil thick, full hard copper C1510, or any equivalent performance alloy. The upper lead frame 110 acts as a spider heat sink or heat slug.

The molding compound 112, such as thermoset or other comparable molding material, mechanically protects the interconnect structures 104 and substantially fixes the relative position of the power semiconductor die 102, the source lead 106, the gate lead 108 and the upper lead frame 110.

Referring now to FIG. 2, therein is shown a top view of the system of FIG. 1 with some internal components shown. The top view of the thermally enhanced power semiconductor package system 100 depicts the power semiconductor die 102 with a large number of the interconnect structures 104 on the source lead 106 and two on the gate lead 108.

The upper lead frame 110, which is electrically connected to the drain lead of the power semiconductor die 102, helps maintain a lower junction temperature under heavy current load. The type and number of contacts are indicative of the amount of current handled by the device. The source lead 106 and the upper lead frame 110, acting as the drain lead, have significantly more contact area connected to the power semiconductor die 102 than the gate lead 108. The amount of current flowing through the gate lead 108 is a small percentage of the current flowing through the source lead 106 and the upper lead frame 110. The upper lead frame 110, source lead 106, and the gate lead 108 are offset from each other at two or more sides of the power semiconductor die 102 to provide at least two power dissipation paths for the power semiconductor die 102.

Figure 3:
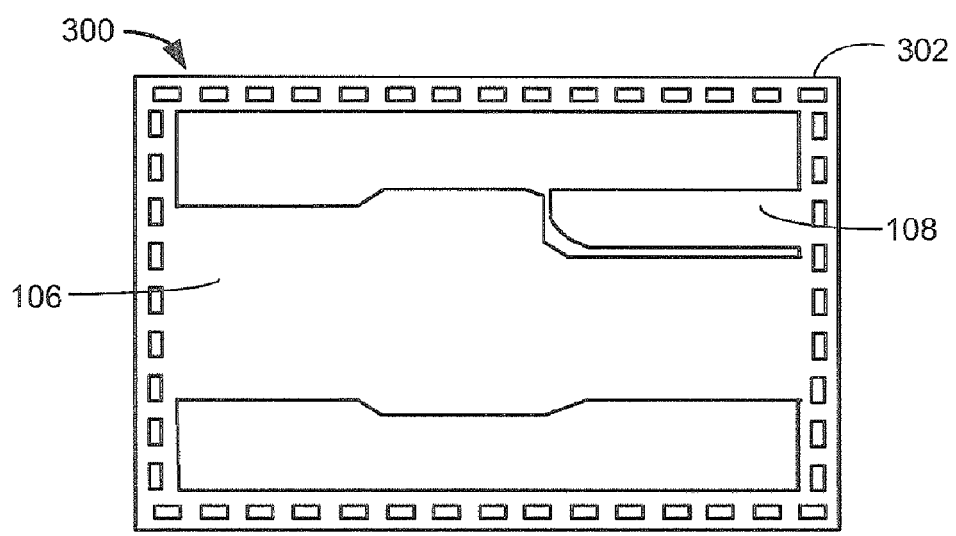
FIG. 3 is a top view of a lower lead frame of the system of FIG. 1.

Referring now to FIG. 3, therein is shown a top view of a lower lead frame 300 for the thermally enhanced power semiconductor package system 100 of FIG. 1. The lower lead frame 300 includes a lead frame dam bar 302, the source lead 106 and the gate lead 108. The lower lead frame 300 may be formed from a number of processes, such as die cut from a large sheet of copper or tin. An instance of the lower lead frame 300 is shown for example only. Although, many of the lower lead frame 300 are in an array and cut. The flat sheet of the lower lead frame 300 may be constructed of 15-20 mil thick, full hard copper C1510, or any equivalent performance alloy, is pressed into a die to establish the desired bends for the components. The lead frame dam bar 302 is trimmed off when the power semiconductor die 102 is removed.

Figure 4:
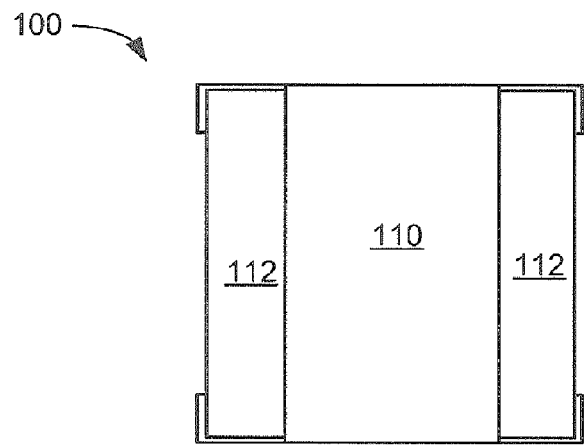
FIG. 4 is a top view of the system of FIG. 1.

Referring now to FIG. 4, therein is shown a top view of the thermally enhanced power semiconductor package system 100 of FIG. 1. The top view of the thermally enhanced power semiconductor package system 100 depicts an upper area of the upper lead frame 110 that is exposed to ambient air. The upper area covered by the molding compound 112 is electrically insulated and forms solder resist regions. The large exposed surface the upper area of the upper lead frame 110, also known as a spider heat sink or heat slug, assists in spreading power dissipation and prevents any one device from running too hot. The upper lead frame 110 also greatly reduces the junction-to-air thermal resistance (θja). A double cooling effect is achieved due to the top and bottom heat dissipation capability of the thermally enhanced power semiconductor package system 100.

Figure 5:
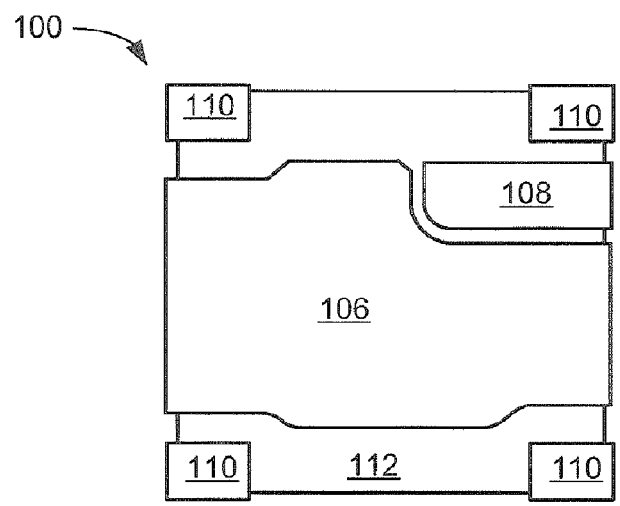
FIG. 5 is a bottom view of the system of FIG. 1.

Referring now to FIG. 5, therein is shown a bottom view of the thermally enhanced power semiconductor package system 100 of FIG. 1. The thermally enhanced power semiconductor package system 100 is shown with the contact areas for the source lead 106, the gate lead 108 as well as the upper lead frame 110. The upper lead frame 110 may form coplanar connection points at the four bottom corners of the thermally enhanced power semiconductor package system 100. The coplanar connection points may be adjacent to each of the corners of the power semiconductor die 102, of FIG. 1, and are coplanar with the source lead 106 and the gate lead 108. The molding compound 112 forms a solder resist region around and between the source lead 106 and the gate lead 108 by encapsulating the upper lead frame 110 while leaving the coplanar connection points exposed.

The source lead 106 and the gate lead 108 are cut from the lower lead frame 300 of FIG. 3 after connection and encapsulation of the power semiconductor die 102 of FIG. 1 during singulation.

The singulation process may be performed with a number of processes, such as a saw or punch process. The surface area of the source lead 106 allows a thermal transfer path to the PCB. In combination with the contact areas of the upper lead frame 110 and the gate lead 108, the contact area of the source lead 106 provides a major thermal transfer path to a printed circuit board (PCB, not shown).

Figure 6:
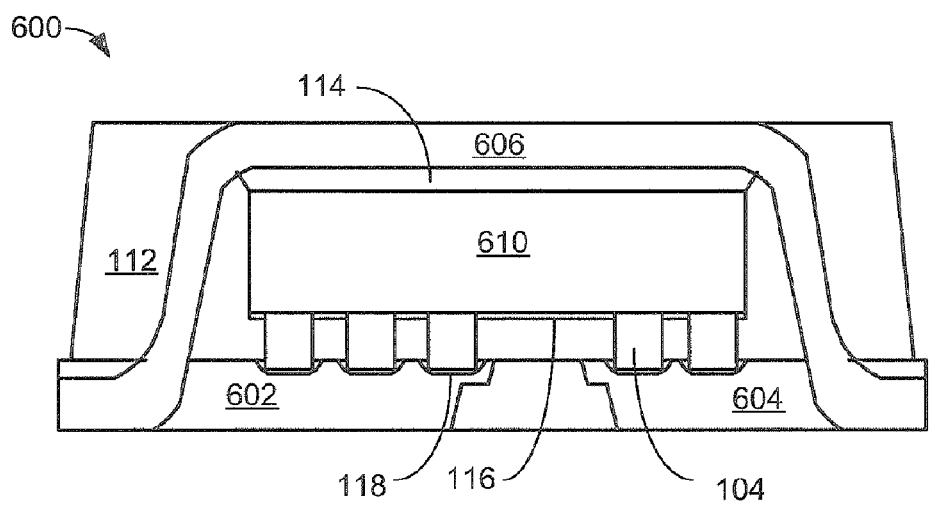
FIG. 6 is a cross-sectional view along line 6-6 of FIG. 7 of a thermally enhanced power semiconductor package system in an alternative embodiment of the present invention.
Figure 7:
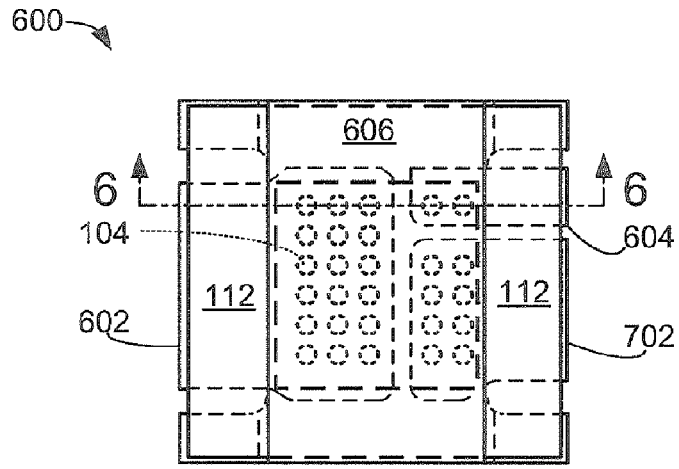
FIG. 7 is a top view of the system shown in FIG. 6 with some internal components shown.

Referring now to FIG. 6, therein is shown a cross-sectional view along line 6-6 of FIG. 7 of a thermally enhanced power semiconductor package system 600 in an alternative embodiment of the present invention. The thermally enhanced power semiconductor package system 600 includes a source lead 602, a gate lead 604, an upper lead frame 606, a center heat sink 608, having partially etched tie bars, a dual source semiconductor device 610, the interconnect structures 104, the molding compound 112 and the soft conductor 114.

The dual source semiconductor device 610 is flipped so it has a die topside metallization layer attached to the upper lead frame 606 by the soft conductor 114. The interconnect structures 104 allow a current path from the die topside metallization layer 116, such as aluminum with PSG over SiN, to the stress relief layer 118, such as molybdenum or other equivalent material. The stress relief layer 118 is connected to the source lead 602 or the gate lead 604. The thermally enhanced power semiconductor package system 600 is sealed by the injection of the molding compound 112.

Referring now to FIG. 7, therein is shown a top view of the thermally enhanced power semiconductor package system 600 shown in FIG. 6 with some internal components shown. The top view depicts the interconnect structures 104, the source lead 602, a second source lead 702, the gate lead 604, the upper lead frame 606, the dual source semiconductor device 610 and the molding compound 112. The dual source semiconductor device 610 is used in circuits (not shown) that have two similar but distinct power sources, such as an I/O bus between two different chips. This configuration can also be used for high current applications that would overstress the power semiconductor die 102 (not shown) of FIG. 1, having a single source. The enhanced thermal characteristics of the thermally enhanced power semiconductor package system 600 allow heavy current usage with reduced junction temperatures. The cut-line 6-6 indicates the position of the view of FIG. 6.

Figure 8:
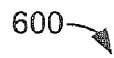
FIG. 8 is a bottom view of the system shown in FIG. 6.

Referring now to FIG. 8, therein is shown a bottom view of an alternative embodiment of the thermally enhanced power semiconductor package system 600 shown in FIG. 6. The bottom view depicts the source lead 602, the second source lead 702, the gate lead 604, the upper lead frame 606 and the molding compound 112. The position of the contacts for the source lead 602, the second source lead 702, the gate lead 604 and the upper lead frame 606 are separated by the molding compound 112 assuring good electrical and thermal contact during assembly. The molding compound 112 forms solder resist regions around the source lead 602, the second source lead 702, the gate lead 604 and the upper lead frame 606.

Figure 9:
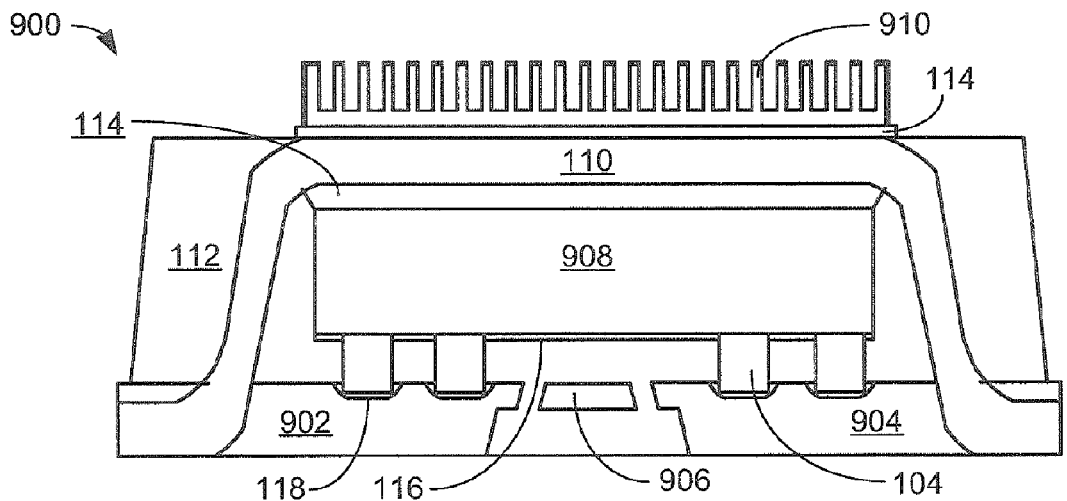
FIG. 9 is a cross-sectional view along line 9-9 of FIG. 10 of a thermally enhanced power semiconductor package system in another alternative embodiment of the present invention.

Referring now to FIG. 9, therein is shown a cross-sectional view of a thermally enhanced power semiconductor package system 900 in another alternative embodiment of the present invention. The cross-sectional view depicts the interconnect structures 104, the molding compound 112, the soft conductor 114, the die topside metallization layer 116, such as phosphosilicate glass (PSG) over silicon nitride (SiN), and the stress relief layer 118, such as molybdenum or other equivalent material. The cross-sectional view also depicts a source lead 902, a gate lead 904, a center heat sink 906, the upper lead frame 110, a dual source semiconductor die 908 and a top heat spreader 910, having surface fins.

The soft conductor 114 electrically and thermally connects the dual source semiconductor die 908 to the upper lead frame 110. The interconnect structures 104 are between the die topside metallization layer 116 and the stress relief layer 118. The stress relief layer 118 expands or contracts to absorb stresses caused by thermal expansion. The molding compound 112, such as thermoset or other comparable molding material, mechanically protects the interconnect structures 104 and substantially fixes the relative position of the source lead 902, the gate lead 904 and the upper lead frame 110. The top heat spreader 910, such as copper or tin, is attached to the upper lead frame 110 with the soft conductor 114 to maximize heat transfer. The increase in surface area provided by the top heat spreader 910 allows an increase in convection cooling for the device. Additional cooling can be derived by attaching the center heat sink 906 to a printed circuit board (PCB) (not shown) forming a heat pipe.

Figure 10:
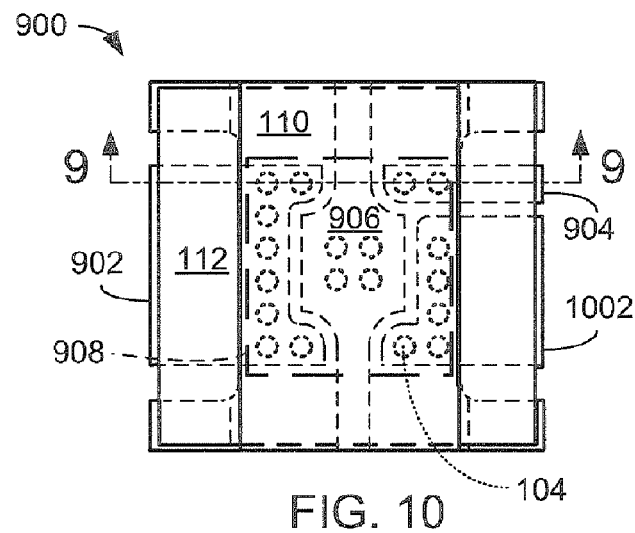
FIG. 10 is a top view of the system shown in FIG. 9 with some internal components shown.

Referring now to FIG. 10, therein is shown a top view of the thermally enhanced power semiconductor package system 900 shown in FIG. 9 with some internal components shown. The top view depicts the interconnect structures 104, the source lead 902, a second source lead 1002, the gate lead 904, the center heat sink 906, the upper lead frame 110, the dual source semiconductor die 908 and the molding compound 112. The top view does not show the top heat spreader 910 (not shown) of FIG. 9 in order to clearly show the other components.

The dual source semiconductor die 908 is used in circuits (not shown) that have two similar but distinct power sources, such as an I/O bus between two different chips. This configuration can also be used for high current applications that would overstress the power semiconductor die 102 (not shown) of FIG. 1, having a single source. The enhanced thermal characteristics of the thermally enhanced power semiconductor package system 900 allow heavy current usage with reduced junction temperatures. The cut-line 9-9 indicates the position of the view of FIG. 9.

Figure 11:
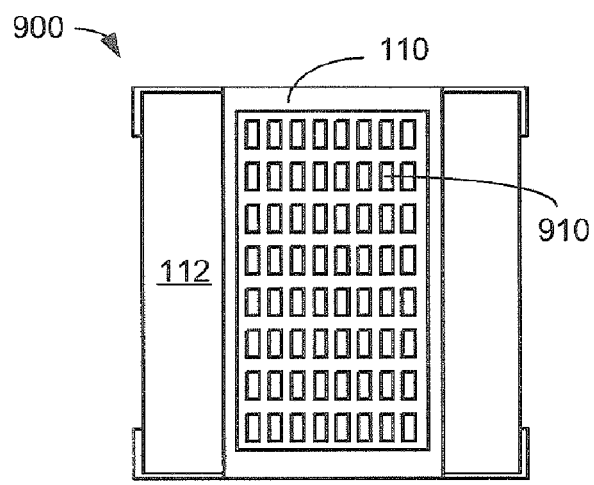
FIG. 11 is a top view of the system shown in FIG. 9.

Referring now to FIG. 11, therein is shown a top view of the thermally enhanced power semiconductor package system 900 shown in FIG. 9. The top view depicts the upper lead frame 110 encased in the molding compound 112 with the top heat spreader 910 electrically and thermally attached to the upper lead frame 110. The top heat spreader 910 increases, such as triples, the surface area of the upper lead frame 110, that is exposed to free air, allowing for very efficient convection cooling.

Figure 12:
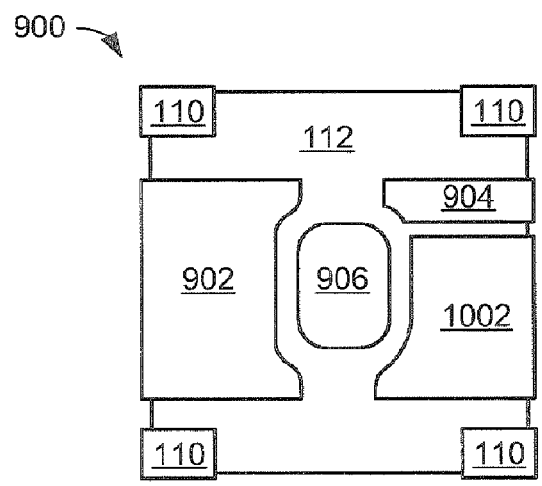
FIG. 12 is a bottom view of the package system shown in FIG. 9.

Referring now to FIG. 12, therein is shown a bottom view of the thermally enhanced power semiconductor package system 900 shown in FIG. 9. The bottom view depicts the upper lead frame 110, the molding compound 112, the source lead 902, the second source lead 1002, the gate lead 904 and the center heat sink 906. The molding compound 112 forms solder resist regions around the upper lead frame 110, the source lead 902, the gate lead 904, the center heat sink 906 and the second source lead 1002. The surface area of the upper lead frame 110, the source lead 902, the gate lead 904, the center heat sink 906 and the second source lead 1002 forms heat transfer paths to the PCB (not shown).

Figure 13:
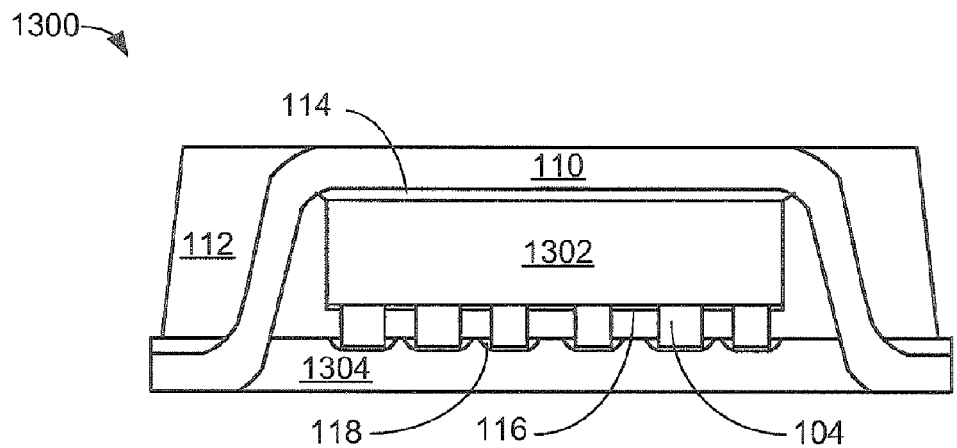
FIG. 13 is a cross-sectional view along line 13-13 of FIG. 12 of a thermally enhanced power semiconductor package system in yet another alternative embodiment of the present invention.

Referring now to FIG. 13, therein is shown a cross sectional view of a thermally enhanced power semiconductor package system 1300 in yet another alternative embodiment of the present invention. The cross-sectional view depicts a power semiconductor die 1302, the interconnect structures 104, a source lead 1304, the upper lead frame 110, the molding compound 112, the soft conductor 114, such as solder paste. The cross-sectional view also depicts the die topside metallization layer 116, such as aluminum with phosphosilicate glass (PSG) over silicon nitride (SiN), and the stress relief layer 118, such as Molybdenum or other equivalent material.

The soft conductor 114 electrically and thermally connects the power semiconductor die 1302 to the upper lead frame 110, which is constructed of 15-20 mil thick, full hard copper C1510, or any equivalent performance alloy. The interconnect structures 104 are between the die topside metallization layer 116 and the stress relief layer 118. The stress relief layer 118 expands or contracts to absorb stresses caused by thermal expansion of the interconnect structures 104. The molding compound 112, such as Thermoset or other comparable molding material, mechanically protects the interconnect structures 104 and substantially fixes the relative position of the source lead 1304 and the upper lead frame 110. The upper lead frame 110 and the source lead 1304, which is part of the lower lead frame 300 (not shown) of FIG. 3, are configured with offset shapes to provide two heat dissipation paths.

Figure 14:
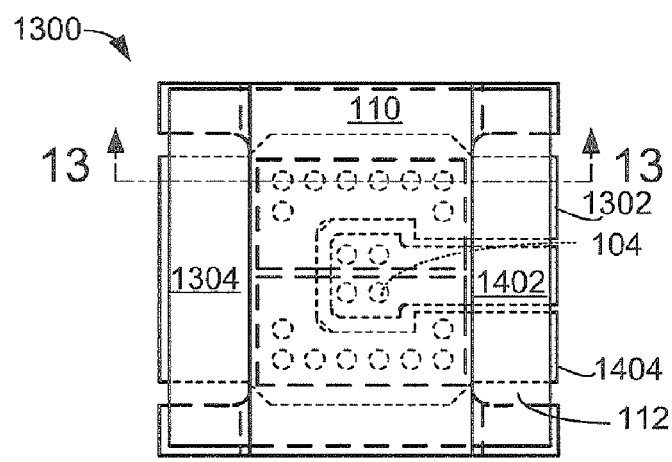
FIG. 14 is a top view of the system shown in FIG. 13 with some internal components shown.

Referring now to FIG. 14, therein is shown a top view of the thermally enhanced power semiconductor package system 1300, shown in FIG. 13, with some internal components shown. The top view depicts the interconnect structures 104, the source lead 1304, a gate lead 1402, the upper lead frame 110, the power semiconductor die 1302, an additional power semiconductor die 1404 and the molding compound 112. The interconnect structures 104 are attached between the power semiconductor die 1302 and the leads of the lower lead frame 300 which are the source lead 1304 and the gate lead 1402.

The thermally enhanced power semiconductor package system 1300 has the power semiconductor die 1302 and the additional power semiconductor die 1404 to support higher current applications. This configuration can also be used for high current applications that would overstress the power semiconductor die 102 (not shown) of FIG. 1, having a single source. The enhanced thermal characteristics of the thermally enhanced power semiconductor package system 1300 allow heavy current usage with reduced junction temperatures.

Figure 15:
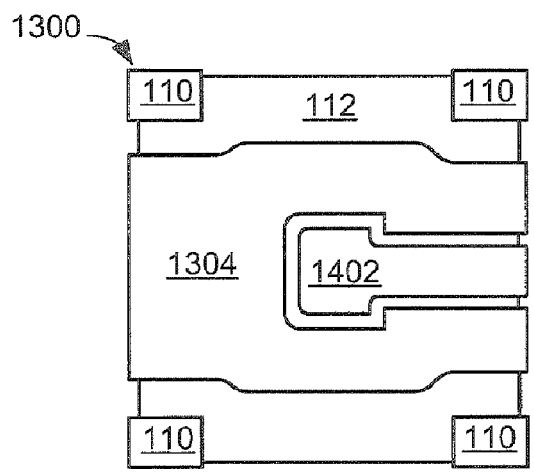
FIG. 15 is a bottom view of the system shown in FIG. 13.

Referring now to FIG. 15, therein is shown a bottom view of the thermally enhanced power semiconductor package system 1300, of FIG. 13. The bottom view depicts the upper lead frame 110, the molding compound 112, the source lead 1304 and the gate lead 1402. The source lead 1304 supplies a current and thermal path from the power semiconductor die 1302 (not shown) and the additional power semiconductor die 1404 (not shown) in the thermally enhanced power semiconductor package system 1300. The large surface area of the source lead 1304 allows a very effective thermal path to the PCB (not shown).

Figure 16:
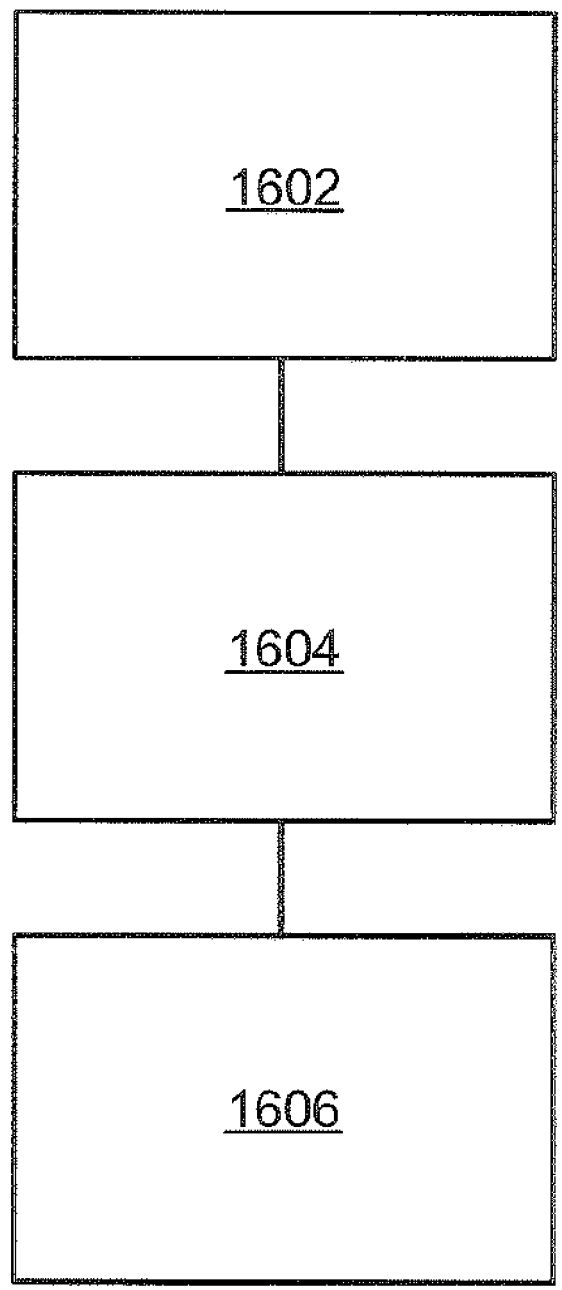
FIG. 16 is a flow chart of a system of thermally enhanced power semiconductor package, in an embodiment of the present invention.

Referring now to FIG. 16, therein is shown a flow chart of a system 1600 of thermally enhanced power semiconductor package, in an embodiment of the present invention. The system 1600 includes providing a power semiconductor die in a block 1602; forming an upper lead frame on the power semiconductor die in a block 1604; and forming a lower lead frame below the power semiconductor die, wherein the upper lead frame and the lower lead frame are provided in an offset configuration relative to each other to provide two heat dissipation paths in a block 1606.

In greater detail, a method for a thermally enhanced power semiconductor package system, in an embodiment of the present invention, is performed as follows:
(1) 1. Providing a power semiconductor die, having a backside metallization layer and a die topside metallization layer. (FIG. 1)
(2) 2. Forming an upper lead frame on the power semiconductor die, further comprising attaching the upper lead frame, with soft conductor, to the backside metallization layer. (FIG. 1) and
(3) 3. Forming a lower lead frame below the power semiconductor die, wherein the upper lead frame and the lower lead frame, in an offset configuration, provide two heat dissipation paths. (FIG. 1)

It has been discovered that the present invention thus has numerous aspects.

An aspect is that the present invention significantly reduces the thermal resistance of the power semiconductor packages by dissipating power through two paths, convection dissipation into the ambient air and thermal transfer into the PCB.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the thermally enhanced power semiconductor package system, of the present invention, furnish important and heretofore unknown and unavailable solutions, capabilities, and functional aspects for packaging semiconductor power devices. The resulting processes and configurations are straightforward, cost-effective, uncomplicated, highly versatile and effective, can be implemented by adapting known technologies, and are thus readily suited for efficiently and economically manufacturing of thermally enhanced stackable package for power semiconductor dice is fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A thermally enhanced power semiconductor package system comprising:
   providing a power semiconductor die;
   forming an upper lead frame, on the power semiconductor die, having coplanar connection points adjacent to each of the corners of the power semiconductor die;
   forming a lower lead frame below the power semiconductor die, wherein the upper lead frame and the lower lead frame are provided in an offset configuration relative to each other at two sides of the power semiconductor die to provide two heat dissipation paths and wherein the lower lead frame below the power semiconductor die having a bottom being coplanar with the connection points.

2. The system as claimed in claim 1 further comprising encapsulating a molding compound around the power semiconductor die, the upper lead frame and the lower lead frame.

3. The system as claimed in claim 1 further comprising providing electrical and thermal contacts on the bottom and top of the thermally enhanced power semiconductor package system with the upper lead frame.

4. The system as claimed in claim 1 further comprises attaching interconnect structures between the lower lead frame and the power semiconductor die.

5. The system as claimed in claim 1 further comprising connecting a center heat sink to form a heat pipe.

6. A thermally enhanced power semiconductor package system comprising:
   providing a power semiconductor die, having a backside metallization layer and a die topside metallization layer;
   forming an upper lead frame, on the power semiconductor die, having coplanar connection points adjacent to each of the corners of the power semiconductor die;
   attach the upper lead frame to the backside metallization layer;
   forming a lower lead frame below the power semiconductor die, wherein the upper lead frame and the lower lead frame, in an offset configuration at two sides of the power semiconductor die, provide two heat dissipation paths and wherein the lower lead frame below the power semiconductor die having a bottom being coplanar with the connection points.

7. The system as claimed in claim 6 further comprising encapsulating a molding compound around the power semiconductor die, the upper lead frame and the lower lead frame and forming solder resist regions.

8. The system as claimed in claim 6 further comprising providing electrical and thermal contacts on the bottom and top of the thermally enhanced power semiconductor package system with the upper lead frame having exposed top surface area for convection heat dissipation and bottom leads for heat transfer.

9. The system as claimed in claim 6 further comprising attaching interconnect structures between a stress relief layer on the lower lead frame and the die topside metallization layer of the power semiconductor die.

10. The system as claimed in claim 6 further comprising connecting a center heat sink to form a heat pipe.

11. A thermally enhanced power semiconductor package system comprising:
   a power semiconductor die;
   an upper lead frame on the power semiconductor die, with coplanar connection points adjacent to each of the corners of the power semiconductor die;
   a lower lead frame below the power semiconductor die, wherein the upper lead frame and the lower lead frame provided in an offset configuration at two sides of the power semiconductor die provide two heat dissipation paths and wherein the lower lead frame below the power semiconductor die having a bottom being coplanar with the connection points.

12. The system as claimed in claim 11 further comprising the power semiconductor die, the upper lead frame and the lower lead frame encapsulated with molding compound.

13. The system as claimed in claim 11 further comprising the upper lead frame with electrical contacts on the bottom and top of the thermally enhanced power semiconductor package system.

14. The system as claimed in claim 11 further comprises interconnect structures attached between the lower lead frame and the power semiconductor die.

15. The system as claimed in claim 11 further comprising a center heat sink connected to form a heat pipe.

16. The system as claimed in claim 11 further comprising:
   the power semiconductor die having a backside metallization layer and a die topside metallization layer;
   the upper lead frame attached to the backside metallization of the power semiconductor die with soft conductor; and
   the lower lead frame, having a first source lead and a first gate lead, below the power semiconductor die, wherein the upper lead frame and the lower lead frame provide two heat dissipation paths.

17. The system as claimed in claim 16 further comprising the power semiconductor die, the upper lead frame and the lower lead frame encapsulated with molding compound, wherein the molding compound forms solder resist regions.

18. The system as claimed in claim 16 further comprising the upper lead frame with electrical contacts on the bottom and top of the thermally enhanced power semiconductor package system with the upper lead frame having exposed top surface area for convection heat dissipation and bottom leads connected for heat transfer.

19. The system as claimed in claim 16 further comprises interconnect structures attached between the stress relief layer on the lower lead frame and the die topside metallization layer of the power semiconductor die.

20. The system as claimed in claim 16 further comprising a center heat sink connected to form a heat pipe.

* * * * *

UNITED STATES PATENT AND TRADEMARK OFFICE
CERTIFICATE OF CORRECTION

PATENT NO. : 7,557,432 B2
APPLICATION NO. : 11/307285
DATED : July 7, 2009
INVENTOR(S) : Tang et al.

It is certified that error appears in the above-identified patent and that said Letters Patent is hereby corrected as shown below:

Column 1, lines 16-17, CROSS-REFERENCE TO RELATED APPLICATIONS section:

Delete

"related to a concurrently filed U.S. Patent Application entitled"

and insert therefor

--related to co-pending U.S. Patent Application Ser. No. 11/307,247 entitled--

Signed and Sealed this

Twenty-fifth Day of August, 2009

David J. Kappos
*Director of the United States Patent and Trademark Office*